US008742965B1

(12) United States Patent
Cosand

(10) Patent No.: US 8,742,965 B1
(45) Date of Patent: Jun. 3, 2014

(54) INHERENTLY MONOTONIC HIGH RESOLUTION DIGITAL TO ANALOG CONVERTER

(75) Inventor: Albert E. Cosand, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 85 days.

(21) Appl. No.: 13/401,979

(22) Filed: Apr. 12, 2012

(51) Int. Cl.
*H03M 1/66* (2006.01)
(52) U.S. Cl.
USPC .............................. 341/144; 341/118; 341/145
(58) Field of Classification Search
USPC ................................................. 341/144–145
See application file for complete search history.

(56) References Cited

U.S. PATENT DOCUMENTS

| 5,257,027 A * | 10/1993 | Murota | 341/153 |
| 5,689,259 A * | 11/1997 | Ozguc | 341/144 |
| 5,703,586 A * | 12/1997 | Tucholski | 341/144 |
| 6,466,149 B2 * | 10/2002 | Tabler | 341/144 |

* cited by examiner

*Primary Examiner* — Khai M Nguyen
(74) *Attorney, Agent, or Firm* — Daniel R. Allemeier; George R. Rapacki

(57) ABSTRACT

Apparatus implementing a monotonic output digital to analog converter (DAC). A high resolution monotonic DAC may be built from a lower resolution DAC using weighting functions that combine the outputs of the lower resolution DAC such that monotonicity is maintained across major carry transitions. The lower resolution DAC should have a true output and a complementary output with a half LSB bias in the output. An extended resolution DAC may be built of; cascaded low resolution DACs; a low resolution DAC in a recursive arrangement with an intermediate storage of its output; or a low resolution DAC with weighting functions that adjust at each of several major carry transition.

14 Claims, 9 Drawing Sheets

| Example | | | | | | | | | | |
|---|---|---|---|---|---|---|---|---|---|---|
| D4 | d3 | d2 | d1 | c3 | c2 | c1 | X | $\overline{X}$ | Y | $\overline{Y}$ |
| 0 | 0 | 0 | 0 | 0 | 0 | 0 | 0.5 | 7.5 | 0.5 | 15.5 |
| 0 | 0 | 0 | 1 | 0 | 0 | 1 | 1.5 | 6.5 | 1.5 | 14.5 |
| 0 | 0 | 1 | 0 | 0 | 1 | 0 | 2.5 | 5.5 | 2.5 | 13.5 |
| 0 | 0 | 1 | 1 | 0 | 1 | 1 | 3.5 | 4.5 | 3.5 | 12.5 |
| 0 | 1 | 0 | 0 | 1 | 0 | 0 | 4.5 | 3.5 | 4.5 | 11.5 |
| 0 | 1 | 0 | 1 | 1 | 0 | 1 | 5.5 | 2.5 | 5.5 | 10.5 |
| 0 | 1 | 1 | 0 | 1 | 1 | 0 | 6.5 | 1.5 | 6.5 | 9.5 |
| 0 | 1 | 1 | 1 | 1 | 1 | 1 | 7.5 | 0.5 | 7.5 | 8.5 |
| 1 | 0 | 0 | 0 | 1 | 1 | 1 | 7.5 | 0.5 | 8.5 | 7.5 |
| 1 | 0 | 0 | 1 | 1 | 1 | 0 | 6.5 | 1.5 | 9.5 | 6.5 |
| 1 | 0 | 1 | 0 | 1 | 0 | 1 | 5.5 | 2.5 | 10.5 | 5.5 |
| 1 | 0 | 1 | 1 | 1 | 0 | 0 | 4.5 | 3.5 | 11.5 | 4.5 |
| 1 | 1 | 0 | 0 | 0 | 1 | 1 | 3.5 | 4.5 | 12.5 | 3.5 |
| 1 | 1 | 0 | 1 | 0 | 1 | 0 | 2.5 | 5.5 | 13.5 | 2.5 |
| 1 | 1 | 1 | 0 | 0 | 0 | 1 | 1.5 | 6.5 | 14.5 | 1.5 |
| 1 | 1 | 1 | 1 | 0 | 0 | 0 | 0.5 | 7.5 | 15.5 | 0.5 |

Figure 5

| Example | | | | | | | | | | | |
|---|---|---|---|---|---|---|---|---|---|---|---|
| D5 | D4 | d3 | d2 | d1 | c3 | c2 | c1 | X | $\bar{X}$ | Y | $\bar{Y}$ |
| 0 | 0 | 0 | 0 | 0 | 0 | 0 | 0 | 0.5 | 7.5 | 0.5 | 31.5 |
| 0 | 0 | 0 | 0 | 1 | 0 | 0 | 1 | 1.5 | 6.5 | 1.5 | 30.5 |
| 0 | 0 | 0 | 1 | 0 | 0 | 1 | 0 | 2.5 | 5.5 | 2.5 | 29.5 |
| 0 | 0 | 0 | 1 | 1 | 0 | 1 | 1 | 3.5 | 4.5 | 3.5 | 28.5 |
| 0 | 0 | 1 | 0 | 0 | 1 | 0 | 0 | 4.5 | 3.5 | 4.5 | 27.5 |
| 0 | 0 | 1 | 0 | 1 | 1 | 0 | 1 | 5.5 | 2.5 | 5.5 | 26.5 |
| 0 | 0 | 1 | 1 | 0 | 1 | 1 | 0 | 6.5 | 1.5 | 6.5 | 25.5 |
| 0 | 0 | 1 | 1 | 1 | 1 | 1 | 1 | 7.5 | 0.5 | 7.5 | 24.5 |
| 0 | 1 | 0 | 0 | 0 | 1 | 1 | 1 | 7.5 | 0.5 | 8.5 | 23.5 |
| 0 | 1 | 0 | 0 | 1 | 1 | 1 | 0 | 6.5 | 1.5 | 9.5 | 22.5 |
| 0 | 1 | 0 | 1 | 0 | 1 | 0 | 1 | 5.5 | 2.5 | 10.5 | 21.5 |
| 0 | 1 | 0 | 1 | 1 | 1 | 0 | 0 | 4.5 | 3.5 | 11.5 | 20.5 |
| 0 | 1 | 1 | 0 | 0 | 0 | 1 | 1 | 3.5 | 4.5 | 12.5 | 19.5 |
| 0 | 1 | 1 | 0 | 1 | 0 | 1 | 0 | 2.5 | 5.5 | 13.5 | 18.5 |
| 0 | 1 | 1 | 1 | 0 | 0 | 0 | 1 | 1.5 | 6.5 | 14.5 | 17.5 |
| 0 | 1 | 1 | 1 | 1 | 0 | 0 | 0 | 0.5 | 7.5 | 15.5 | 16.5 |
| 1 | 0 | 0 | 0 | 0 | 0 | 0 | 0 | 0.5 | 7.5 | 16.5 | 15.5 |
| 1 | 0 | 0 | 0 | 1 | 0 | 0 | 1 | 1.5 | 6.5 | 17.5 | 14.5 |
| 1 | 0 | 0 | 1 | 0 | 0 | 1 | 0 | 2.5 | 5.5 | 18.5 | 13.5 |
| 1 | 0 | 0 | 1 | 1 | 0 | 1 | 1 | 3.5 | 4.5 | 19.5 | 12.5 |
| 1 | 0 | 1 | 0 | 0 | 1 | 0 | 0 | 4.5 | 3.5 | 20.5 | 11.5 |
| 1 | 0 | 1 | 0 | 1 | 1 | 0 | 1 | 5.5 | 2.5 | 21.5 | 10.5 |
| 1 | 0 | 1 | 1 | 0 | 1 | 1 | 0 | 6.5 | 1.5 | 22.5 | 9.5 |
| 1 | 0 | 1 | 1 | 1 | 1 | 1 | 1 | 7.5 | 0.5 | 23.5 | 8.5 |
| 1 | 1 | 0 | 0 | 0 | 1 | 1 | 1 | 7.5 | 0.5 | 24.5 | 7.5 |
| 1 | 1 | 0 | 0 | 1 | 1 | 1 | 0 | 6.5 | 1.5 | 25.5 | 6.5 |
| 1 | 1 | 0 | 1 | 0 | 1 | 0 | 1 | 5.5 | 2.5 | 26.5 | 5.5 |
| 1 | 1 | 0 | 1 | 1 | 1 | 0 | 0 | 4.5 | 3.5 | 27.5 | 4.5 |
| 1 | 1 | 1 | 0 | 0 | 0 | 1 | 1 | 3.5 | 4.5 | 28.5 | 3.5 |
| 1 | 1 | 1 | 0 | 1 | 0 | 1 | 0 | 2.5 | 5.5 | 29.5 | 2.5 |
| 1 | 1 | 1 | 1 | 0 | 0 | 0 | 1 | 1.5 | 6.5 | 30.5 | 1.5 |
| 1 | 1 | 1 | 1 | 1 | 0 | 0 | 0 | 0.5 | 7.5 | 31.5 | 0.5 |

Figure 7

INHERENTLY MONOTONIC HIGH RESOLUTION DIGITAL TO ANALOG CONVERTER

This invention was made with Government support and the Government has certain rights in the invention.

BACKGROUND

When a digital to analog converter (DAC) converts the input digital bits into an analog output, each bit is assigned a weight. The sum of all weighted bits is then the analog output. However, the weights typically are not exactly the desired values. For example, although weights of 4, 2 and 1 are desired, they may actually be 3.4, 2.25 and 1.25. The result is that the analog output may not always increase as the digital input increases.

The problem is most pronounced at "major carry" transitions in the input code, as exemplified by the midscale transition between input code [0,1,1,..., 1,1] and [1,0,0,..., 0,0]. As the number of bits increase, the tolerances on individual bit weights decreases. More stringent tolerances on bit weights increase the cost of DACs and can limit the number of bits a DAC can accept. A corollary consequence is precision control based on non-monotonic DACs is difficult to ensure.

Previously known approaches to building precision DACs with more than 12 bits required very precise component matching and/or calibration to maintain monotonicity. More than 12 bits would require expensive or even unrealistic component tolerances. An alternative solution offering a guaranteed monotonic DAC used a thermometer code for the most significant bits and dithered the least significant bits. While this design may guarantee monotonicity, it may not allow the precise analog control desired in some applications.

A DAC is needed with a monotonic output at all transitions. Such a DAC should be extendable to a large number of bits without requiring components with unusually stringent tolerances.

SUMMARY

The problem of non-monotonic N+1 bit digital to analog converters (DACs) is solved by using an N bit differential DAC with true and complement outputs, where the outputs are offset by a half Least Significant Bit (LSB) and creating the N+1 bit output from appropriately weighted sums of the N bit DAC's outputs, where the transition at the major bit transition involves only the half LSB offset.

In a first embodiment N+M bit Digital to Analog converter (DAC) comprising: an N bit digital to analog converter (DAC) with a true output and a complementary output; wherein the true output and complementary output of the N bit digital to analog converter are offset by substantially a half LSB; a first weighting processor producing a true output of the N+M bit digital to analog converter, wherein the true output is a weighted combination of the true and complementary outputs of the N bit digital to analog converter; a second weighting processor producing a complementary output of the N+M bit digital to analog converter, wherein the complementary output is a weighted combination of the true and complementary outputs of the N bit digital to analog converter; wherein the first and second weighting processors adjust at each major carry transition of M most significant input bits such that the true output and complementary output are monotonic.

In another embodiment, a N+1 bit Digital to Analog Converter (DAC) comprising: an N bit DAC wherein the N bit DAC has a true output and a complementary output and wherein the outputs are offset by substantially a half LSB; an input processor accepting N+1 input bits and supplying N input bits to the N bit DAC such that the input processor maintains the input to the N bit DAC across a major carry transition of the N+1 input bit; a first processing unit producing a true output of the N+1 bit DAC, wherein the output is a weighted combination of the complementary output of the N bit DAC and the true output of the N bit DAC; wherein the weighting is such that the true output of the N+1 bit DAC is monotonic across the change of the N+1 input bit; a second processing unit producing a complementary output of the N+1 bit DAC, wherein the output is a weighted combination of the complementary output of the N bit DAC and the true output of the N bit DAC; wherein the weighting is such that the complementary output of the N+1 bit DAC is monotonic across the change of the N+1 input bit.

In another embodiment, a N+2 bit digital to analog converter (DAC) comprising: N+2 input bits, a true analog output and a complementary analog output; an N bit digital to analog converter (DAC) wherein the N bit converter has N input bits, a true output and a complementary output and wherein the outputs are offset by substantially a half LSB; a first switch wherein the complementary output of the N bit converter is switched to either a first output, a second output or a third output of said first switch according to the state of the N+2 and N+1 input bits; a second switch wherein the true output of the N bit converter is switched to either a first output or a second output of said second switch according to the state of the N+2 and N+1 input bits; an exclusive OR gate accepting the N+1 input bits and supplying the N input bits of the N bit DAC wherein each of the N input bits is exclusively OR'd with the N+1 bit; a first processing unit with an output and first, second, third and fourth inputs wherein the output is the complementary output of the N+2 bit DAC, the first input is connected to the first output of the first switch, the second input is connected to the first output of the second switch, the third input is connected to the second output of the first switch and the fourth input is connected to the second output of the second switch; a second processing unit with an output and first, second, third and fourth inputs; wherein the output is the true output of the N+2 bit DAC, the first input is connected to the first output of the second switch, the second input is connected to the second output of the first switch, the third input is connected to the second output of the second switch and the fourth input is connected to the third output of the first switch; wherein the first processing unit output is the sum of first input multiplied by a first scale factor, the second input; multiplied by a second scale factor, the third input multiplied by a third scale factor and the fourth input multiplied by a fourth scale factor wherein the second processing unit output is the sum of the first input multiplied by the fourth scale factor, the second input multiplied by the third scale factor, the third input multiplied by the second scale factor and the fourth input multiplied by the first scale factor.

Other embodiments use M N+1 bit DACs in cascade to comprise a N+M bit DAC. In another embodiment the N+M bit DAC may be built of a cascade of N+1 bit DACs and zero or more N+2 bit DACs.

DESCRIPTION OF THE DRAWINGS

The objects, features and advantages of the invention will be apparent from the following detailed description of the preferred embodiment of the invention in conjunction with reference to the following drawings where:

FIG. 5 is a table showing the output of the N+1 bit DAC of FIG. 4 when N is three.

FIG. 7 is a table showing the output of the N+2 bit DAC of FIG. 6 when N is three.

DESCRIPTION

Figure 1:
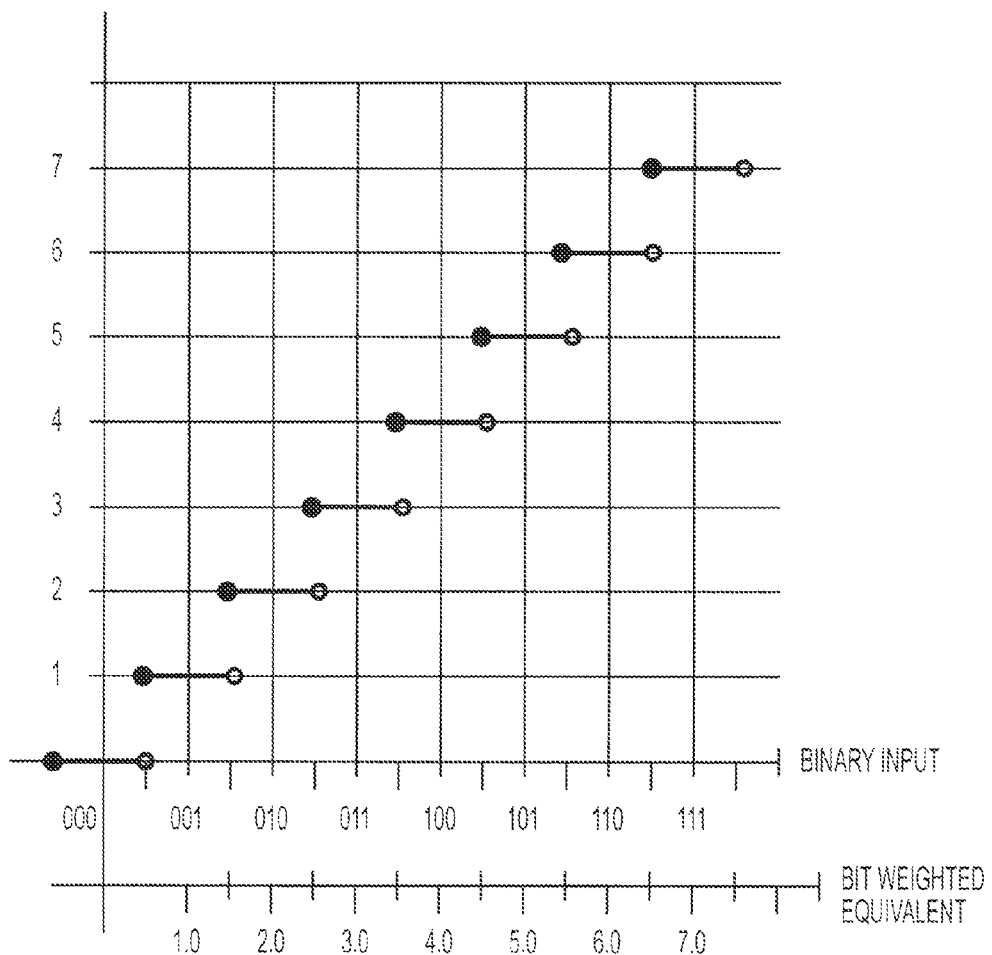
FIG. 1 shows the ideal output of a three bit digital to analog converter.

The following description is presented to enable one of ordinary skill in the art to make and use the invention and to incorporate it in the context of particular applications. Various modifications, as well as a variety of uses in different applications will be readily apparent to those skilled in the art, and general principles defined herein may be applied to a wide range of embodiments. Thus the invention is not intended to be limited to the embodiments presented, but is to be accorded the widest scope consistent with the principles and novel features disclosed herein.

In the following detailed description, numerous specific details are set forth in order to provide a more thorough understanding of the invention. However, it will be apparent to one skilled in the art that the invention may be practiced without necessarily being limited to specific details. In other instances, well-known structures and devices are shown in block diagram form, rather than in detail, in order to avoid obscuring the present invention.

All features disclosed in this specification, (including any accompanying claims, abstract, and drawings) may be replaced by alternative features serving the same, equivalent or similar purpose, unless expressly stated otherwise. Unless expressly stated otherwise, each feature disclosed is one example only of a generic series of equivalents or similar features.

Any element in a claim that does not explicitly state "means for" performing a specified function, or "step for" performing a specific function, is not to be interpreted as a "means" or "step" clause as specified in 35USC Section 112, Paragraph 6. In particular, the use of step of or act of in the claims herein is not intended to invoke the provisions of 35USC Section 112 Paragraph 6.

The invention will be described with reference to the accompanying drawings. This invention may be embodied in many different forms and should not be construed as limited to the embodiments set forth herein. Further, the dimensions, materials and other elements shown in the accompanying drawings may be exaggerated to show details. The invention should not be construed as being limited to the dimensional or spatial relations or symmetry shown in the drawings, nor should the individual elements shown in the drawings be construed to be limited to the dimensions shown.

Figure 2:
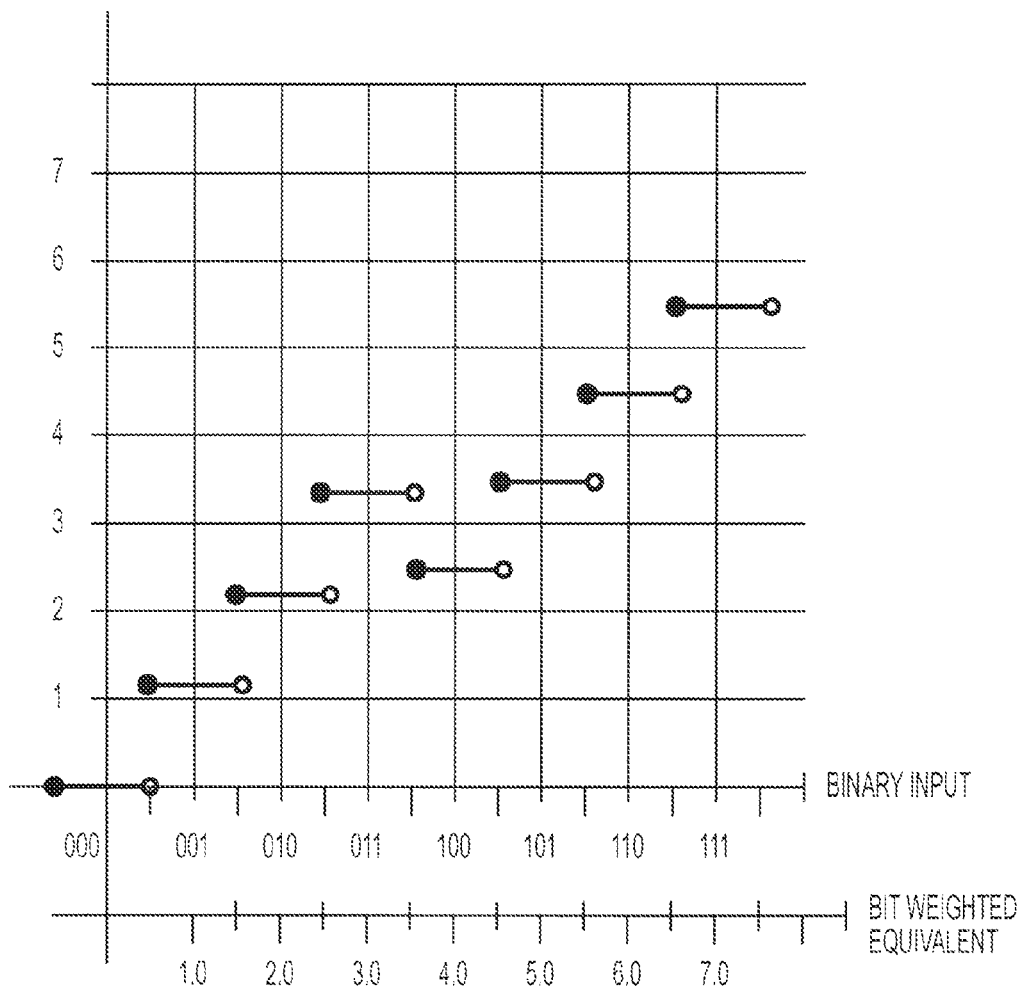
FIG. 2 illustrates the non-monotonicity when the error in the weighting of the most significant bit (for example) is large enough and of opposite sign of the errors in the lower significant bits.

This invention describes a method and apparatus for converting a digital input to a monotonic analog output, despite large errors in the weighting of individual bits. When a digital to analog converter (DAC) converts the input digital bits into an analog output, each bit is assigned a weight. The sum of all weighted bits is then the analog output. For example, for a three bit digital value b2b1b0 the output is b2*w2+b1*w1+b0*w0. The weights w2, w1 and w0 should be 4, 2 and 1. The result is shown in FIG. 1, a monotonic output. However, the weights typically are not exactly 4, 2 and 1. For example, they may actually be 3.4, 2.25 and 1.25. This is shown in FIG. 2. When the input count goes from 011 to 100, that is at the major carry transition, the output will change from 3.5 to 3.4. The decrease in output when the input increases is non-monotonicity and is undesirable.

The problem is most pronounced at "major carry" transitions in the input code, as exemplified by the midscale transition between input code [0,1,1,..., 1,1] and [1,0,0,..., 0,0]. A major carry transition is not limited to N lower order bits and one higher order bit. Two most significant bits will have a major carry transition three times for the N lower order bits. This is illustrated in FIG. 7 and explained below. As an example and not as a limitation, DAC implementations with binary-weighted current sources or binary-weighted capacitor arrays should have the sum of the values of the N smaller terms equal to 1 LSB (Least Significant Bit) less than the value of the larger term (N+1st value) within a precision of less than 1 LSB to maintain monotonicity. As the number of bits increases, the tolerances on components to achieve individual bit weights decreases. This is one reason, but not the only reason, that precision control based on non-monotonic DACs is difficult to ensure.

Figure 4:
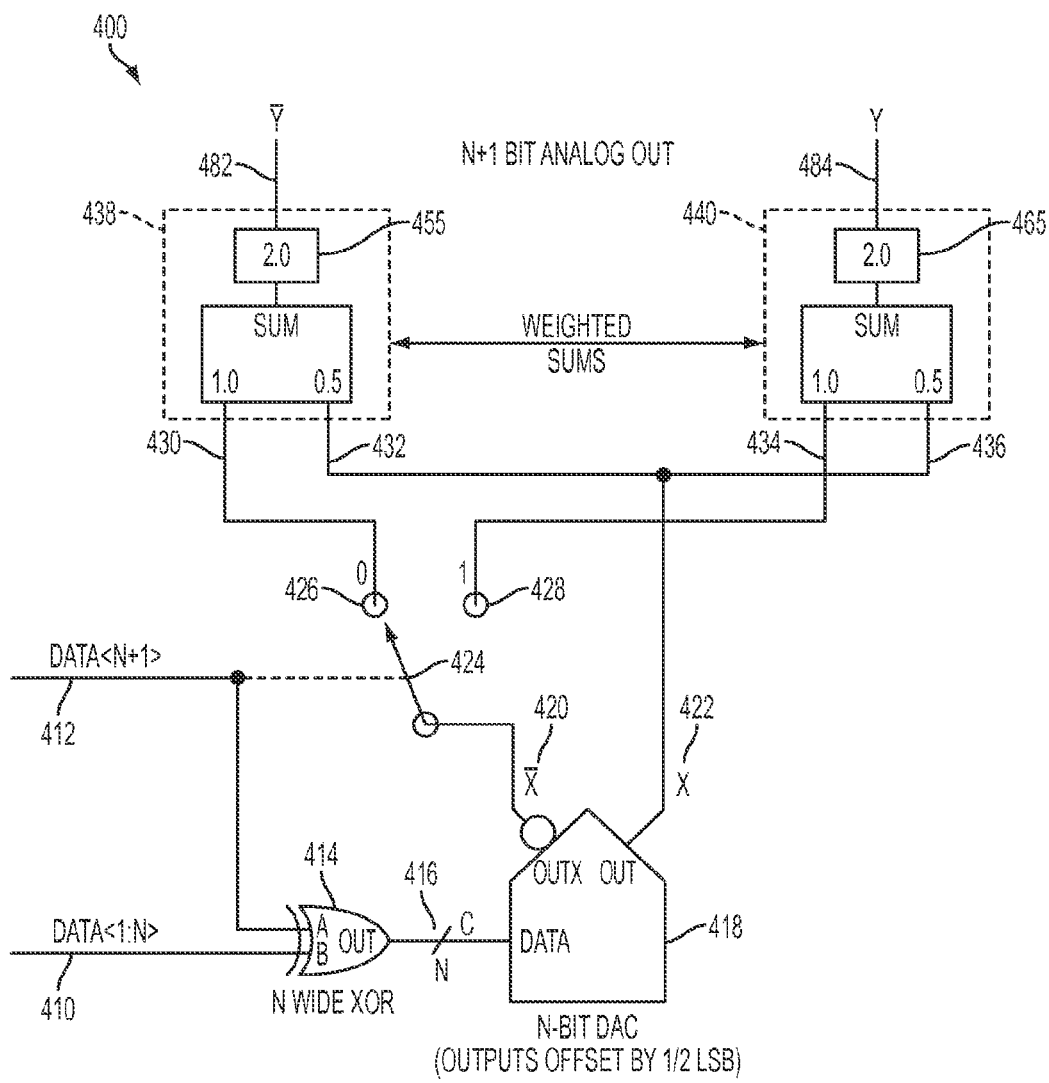
FIG. 4 illustrates an embodiment of an N+1 bit DAC given an N bit DAC with half LSB offset in the output, a switch and two summers.

The embodiment in FIG. 4 shows an example solution. The N+1 bit DAC 400 of FIG. 4 is built of an N bit DAC, an N bit Exclusive OR function, a switch and two weighting functions.

Figure 3:
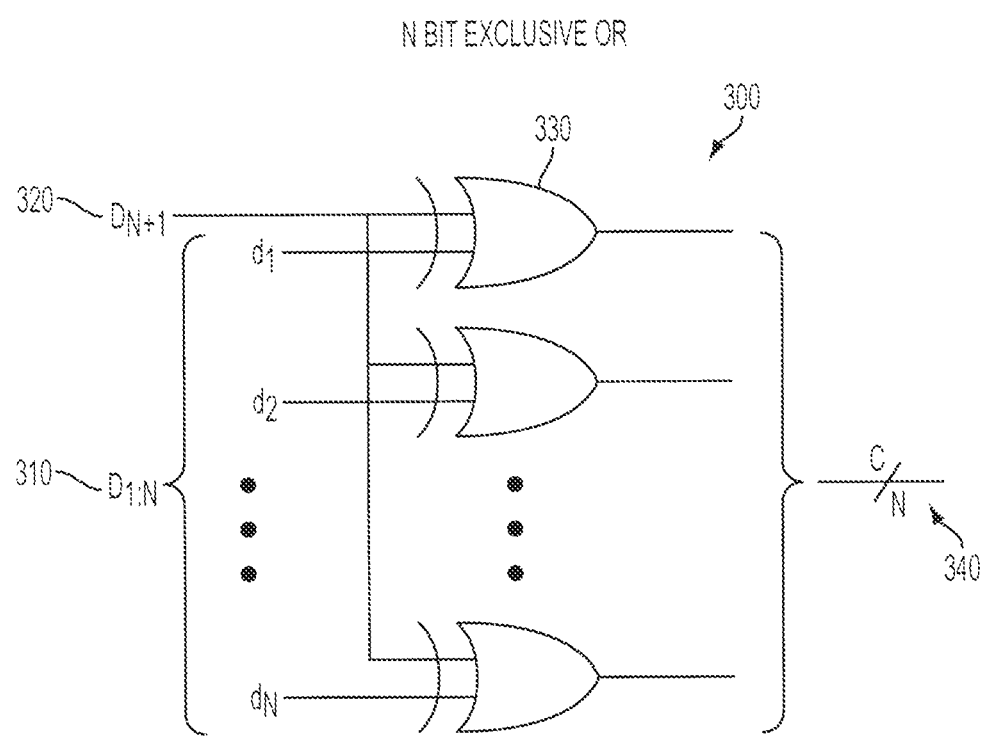
FIG. 3 illustrates an N bit Exclusive OR gate used in the DAC of FIG. 4.

The N bit Exclusive OR 300 function shown in FIG. 3 ensures the output 340 will count up as the N bits of the input increase and then count down when the N bits reach a major carry transition. An alternative description of the N bit Exclusive OR function is that it maintains the input to the N bit DAC across the major carry transition. This is illustrated in FIG. 5 for N=3. The input 310 of the Exclusive OR 300 is shown in columns labeled d3d2 and d1. The output 340 of the Exclusive OR is in columns c3, c2 and c1. Note that c3c2c1 counts up as d3d2d1 counts up and then, when D4 changes from 0 to 1, c3c2c1 counts down. But across the major carry transition, the input d3d2d1 remains the same.

Returning to FIG. 4, FIG. 4 shows an N+1 bit DAC 400. The N+1 bit DAC 400 is built of an N bit DAC 418, two weighting functions 438 and 440, a switch 424 and an N bit Exclusive OR 414. The N bit Exclusive OR 414 is shown in FIG. 3 and is described above. The weighting functions 438 and 440 may be implemented in a variety of technologies. Essentially, they scale their analog inputs 430 and 432 for weighting function 438 (and 434 and 436 for weighting function 440) by the weighting factor indicated for the particular analog input. The N bit DAC 418 can be implemented in a number of ways. The requirements on this DAC, which are easily implemented, are that it have differential outputs 420 and 422, and that its output be offset by one-half LSB. By differential outputs it is meant that where the true output 422 ranges from half LSB to some positive value $(2^N-\frac{1}{2}\text{LSB})$, the complementary output 420 equals the maximum value $2^N$ less the true output. As the N bit DAC input code 416 is incremented from [0, 0, ..., 0] its true output 422 in units of its LSB will be 0.5, 1.5, 2.5, ... rather than the normal 0, 1, 2, .... The complementary output is 7.5, 6.5, 5.5, ... to 0.5 for N equals three. The switch 424 switches the complementary output 420 of DAC 418 from 426 to 428 when the N+1 bit 412 changes from zero to one, that is at a major carry transition. The true output 422 of the DAC 418 is connected to the half weight 432 and 436 inputs of weighting functions 438 and 440 respectively.

The true output 422 for a given input 416 is an analog value proportional to the decimal value of the binary input 416. If the input 416 is [1001] then the true output is proportional to 9. The corresponding complementary output is proportional to $2^4$ less the true output, not the negative or inverted value. If the input 416 is [1001] then the complementary output 422 is proportional to 16-9 or 7.

The weighted sums of the outputs 420, 422 are combined as shown in 438 and 440 of FIG. 4. For example: when the N+1 bit 412 is zero, the switch 424 is in the zero or 426 position; the complement output 482 of the N+1 bit DAC 400 is the sum of the complement output of the N-bit DAC 420 and ½ of its true output 422; while the true output 484 of the N+1 bit DAC 400 is ½ of the true output 422 of the N bit DAC 418.

The operation of the N+1 bit DAC is shown in the table in FIG. 5. Columns c3c2c1 are the outputs of the N bit Exclusive OR 414, columns X and $\overline{X}$ are the outputs 422 and 420, respectively, of the N bit DAC and columns Y and $\overline{Y}$ are the outputs 484 and 482 of the N+1 bit DAC. As the N+1 bit code D4d3d2d1 of the input 412/410 is incremented from [0, 0, . . . , 0] to [0, 1, . . . , 1], the N bit DAC 418 will count through its entire range, so that at [0, 1, . . . 1] its full scale true output 422 shown in column X of FIG. 5 is split evenly between the true output 484 in column Y and complement output 482 in column $\overline{Y}$ of the N+1 bit DAC 400. Concurrent with N bit input 416 reaching all ones, the complement output 420 $\overline{X}$ of the N bit DAC 418 is at its minimum value of ½ LSB. At the major carry transition when D4 goes from 0 to 1 and the input D4d3d2d1 goes from [0, 1, . . . , 1] to [1, 0, . . . , 0]: the bank of exclusive-or gates 414 inverts all of the inputs 416 to the N bit DAC 418 as the most significant bit (MSB) 412 changes from 0 to 1, D4 in FIG. 5; the N bit code 416, d3d2d1 in FIG. 5, controlling the N bit DAC remains at [1, . . . , 1]; and the complement output 420 of the N bit DAC, X column in FIG. 5, is switched by 424 from being summed into the complement output 482 to the true output 484 of the N+1 bit DAC 400. Thus the only change in the output of the N+1 bit DAC 400 at the major carry is the transfer of ½ LSB of the N bit DAC 418 from the complement 482 to the true output 484 of the N+1 bit DAC 400, corresponding to a 1 bit change in the output of the N+1 bit DAC 400. As the N+1 bit input code is further incremented from [1, 0, . . . , 0] to [1, 1, . . . , 1], the inverted N bits 416 to the N bit DAC 418 count down from [1, . . . , 1] to [0, . . . , 0], so that the output 422 of the N bit DAC 418 is smoothly transferred to the true output 484 of the N+1 bit DAC 400. Thus, over the full range of the N+1 bit word 412/410 from [0, 0, . . . , 0] to [1, 1, . . . , 1], the true output 484 of the N+1 bit DAC 400 ranges over $2^{N+1}$ steps from ¼ LSB of the N bit DAC 418 to $\{(2^N-1)+¼ \text{ LSB}\}$ of the N bit DAC 418 in steps of ½ LSB of the N bit DAC 418. The result is an N+1 bit DAC 400 with its outputs 482, 484 offset by ½ LSB of the N+1 bit DAC.

As can be seen in FIG. 5, at the major carry transition the input c3c2c1 to the N bit DAC continues as the mirror image of the previous values. The true output X 422 and complementary outputs $\overline{X}$ 420 do not change but the true output Y 484 of the N+1 bit DAC increments by virtue of the switching 424 from 426 to 428 of the complementary output $\overline{X}$ 420 in FIG. 4.

Figure 6:
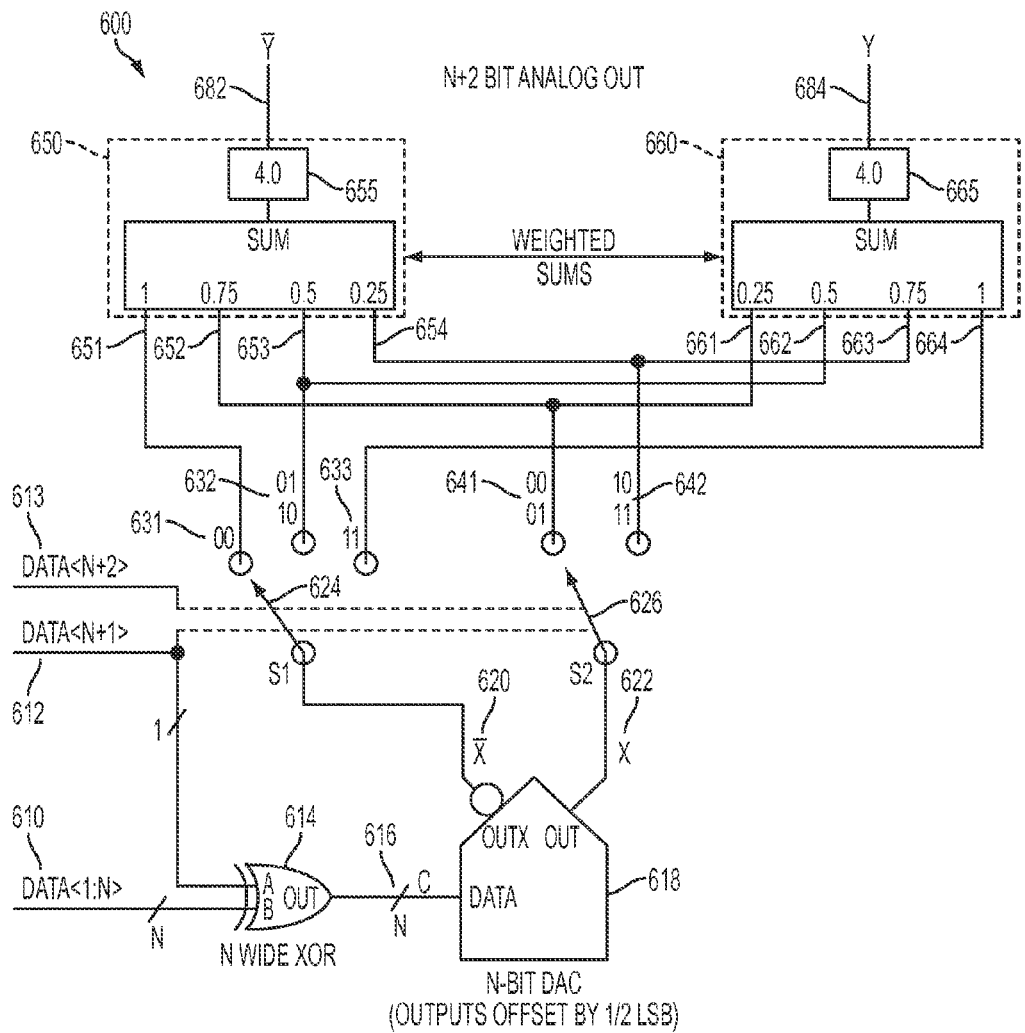
FIG. 6 illustrates an embodiment of an N+2 bit DAC given an N bit DAC with half LSB offset in the output.

This technique may be expanded to increase the resolution of the initial DAC by more than one bit, as illustrated by the embodiment in FIG. 6 where the resolution of the initial DAC 618 is increased by two bits. FIG. 6 shows an N+2 bit DAC 600 built from an N bit DAC 618. The most significant bits 612 and 613 define three major carry transitions. As the N+2 bit input (613, 612, 610) varies from [0, 0, 0, . . . , 0] to [0, 0, 1, . . . , 1], the N bit DAC 618 counts up through its range while both switches S1 624 and S2 626 are in their left-most positions 631 and 641 respectively. Over this range, the complementary output 682 of the N+2 bit DAC 600 decreases from its maximum value to about 0.75 of maximum value while true output 684 increases from minimum to about 0.25 of full scale. At the major carry transition where the N+2 (613, 612, 610) bit code transitions from [0, 0, 1, . . . , 1] to [0, 1, 0, . . . , 0] the switch S1 624 is moved to its middle position 632, and the Exclusive Or gate 614 inverts the input 616 to the N bit DAC 618 so that it remains at [1, . . . , 1]. As S1 624 is switched, the ½ LSB offset of the N bit DAC 618 is transferred from the complementary output 682 to being split evenly by the weighting functions 650 and 660 between the true output 684 and the complementary output 682, thus ensuring a well controlled transition in the N+2 bit DAC output 684 at this carry. Over the N+2 bit code range from [0, 1, 0, . . . , 0] to [0, 1, 1, . . . , 1] the N bit DAC 618 counts down (because its inputs 616 are inverted when the N+1$^{st}$ bit 612 is "1"); the complementary output 682 of the N+2 bit DAC 600 covers the range from 0.75 to 0.5 of full scale while the true output 684 ranges from 0.25 to 0.5 of full scale. At the transition from [0, 1, 1, . . . , 1] to [1, 0, 0, . . . , 0] in the N+2 bit input, the input 616 to the N bit DAC is no longer inverted, so it remains at [0, . . . , 0], and S2 626 is switched to the right, transferring the ½ LSB offset of the N bit DAC 618 from a weight of 0.75 to 0.25 in the sum forming the complementary output 682 and from a weight of 0.25 to 0.75 in the sum forming true output 684, providing a smooth transition across this carry. Similarly, the N bit DAC 618 counts up over the range from 0.5 to 0.25 of full scale in the complementary output 620 and 0.5 to 0.75 in true output 622 and counts down over the range 0.25 to 0 in complementary output 620 $\overline{X}$ and 0.75 to 1 in true output X 622. At each of the major carries the output of the N bit DAC 618 that is carrying its full scale output remains connected as it was, and the output that is carrying only the ½ LSB offset is the one that is switched to change the output of the N+2 bit DAC by 1 LSB, maintaining the monotonicity.

The switches 624 and 626 alternate at each major carry transition. For each position 631 to 633 and 641 to 642 in FIG. 6 there is the associated bit pattern for the switch 624 and 626 positions. One can see that as the N+2, N+1 bits count from 00 to 01 only switch 624 will switch from the 631 position to the 632 position and when the count changes from 01 to 10 switch 624 holds while switch 626 moves from 641 to 642.

FIG. 7 shows a table of the outputs of the N+2 bit DAC 600 as a function of the inputs for N=3. As can be seen, the bits 616 driving the N Bit DAC 618 count up then count down under the control of D5 and D4. IF D5D4 is even, then the N Bit DAC 618 input c3c2c1 counts up. If D5D4 is odd, then the N Bit DAC 618 counts down. At each carry transition in D5D4 the switches 624 and 626 alternately "rotate" to the right as the count D5D4 increases. The references 631, 632, 633, 641 and 642 of FIG. 6 show the switch positions for the D5D4 values indicated. The reference to the switch "rotating" is not intended to be limited to physical movement in the mechanical sense but is a conceptual description to explain the function. A person skilled in the art would be able to construct a switch that accomplishes the function described with no moving parts.

Figure 8:
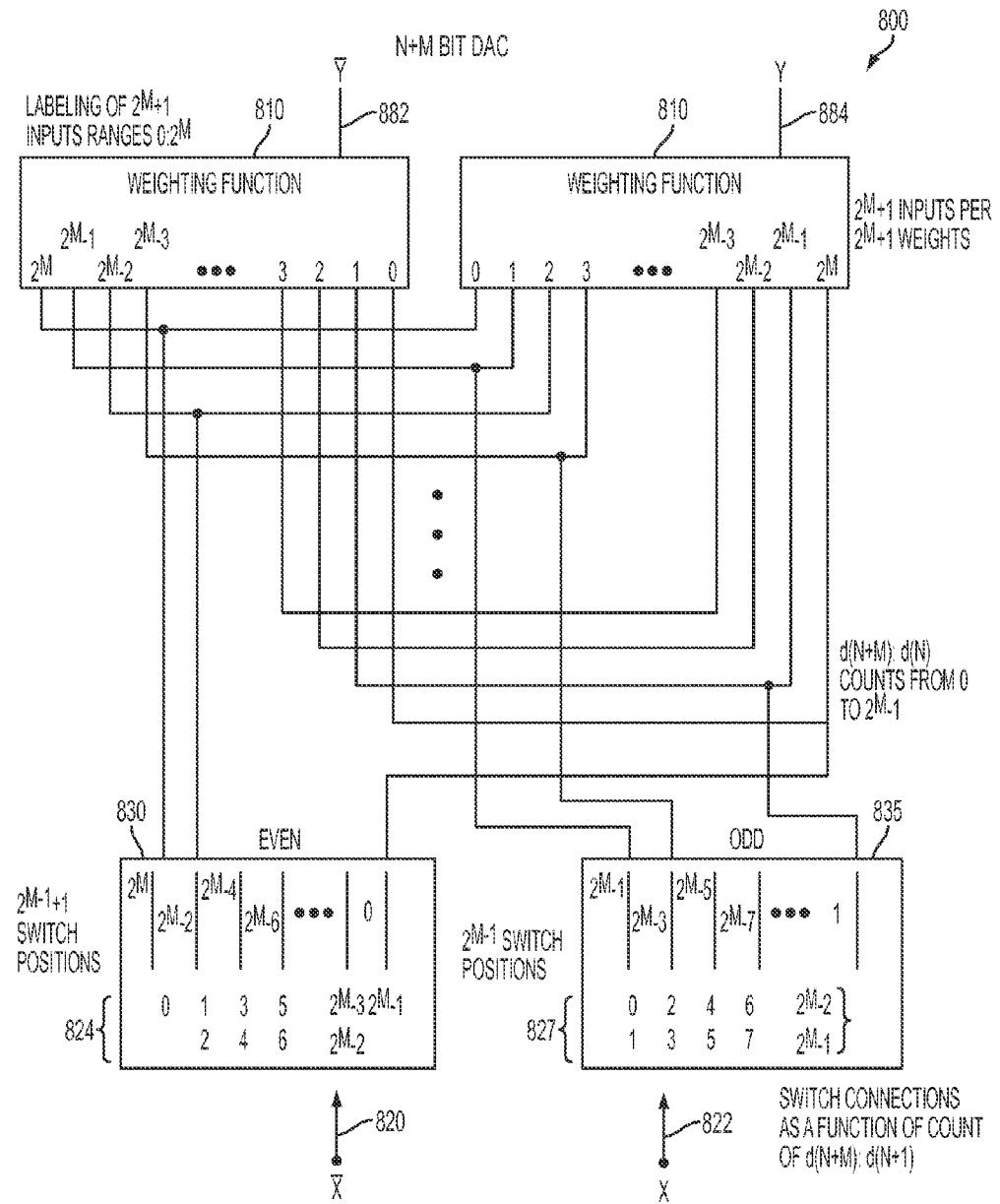
FIG. 8 shows the switching and weighting functions of a generalized N+M bit DAC.

The extension of this technique to provide M bits of increased resolution is straightforward. Extending this technique to add M bits to a monotonic N bit DAC requires weighting functions with 2M inputs and switches with 2M outputs. The N bit DAC can be made to alternately count up and down across the operating range so that the complementary and true signal from the N bit DAC is switched at the carry points defined by the M extra bits. At each carry point either the true output or the complementary output that is switched has the value of only the ½ LSB offset. FIG. 8 shows a generalized N+M bit DAC with monotonic outputs. The N bit DAC and N bit Exclusive OR functions have been omitted from the figure since they are connected and operate as described for FIGS. 4 and 6. The N+M Bit DAC is built from two weighting functions 810 A and B with weights as indicated for each input. That is, the $2^M-3$ input has a weight of $2^M-3$ applied to the input. This is not a contradiction with FIG. 6 since the generalized weighting function 810 does not use the scaling functions 655 and 665 of FIG. 6, or rather the scaling functions are combined into the weights. If scaling functions 655 and 665 were present in FIG. 8 their value would be $2^M$ and each weight on the input would be divided by $2^M$. Note the weighting function 810 is used twice (A and B) and it has an input with a weight of zero. The zero weight input was not drawn in FIG. 6 but shown in FIG. 8 to highlight the symmetry in the embodiment. The switch 830 switches the complementary input 820 to the specified input of the weighting function 810A when the controlling bits d(N+M):d(N+1) represent the values 824 shown for switch 830. Likewise, switch 835 switches the true input 822 to the indicated input of the weighting function 810B when the controlling bits d(N+M):d(N+1) represent the values 827 shown for switch 835. Switches 830 and 835 are not identical. Switch 830 has $2^{M-1}+1$ switch positions and switch 835 has $2^{M-1}$ switch positions. In operation, each time the switch 830 or 835 changes, a ½ LSB is switched from one weighting function 810 to the other.

When an N Bit DAC 418 (or 618) and N Bit wide Exclusive OR 300 (or 614) is added to FIG. 8, one obtains an N+M bit DAC.

Figure 9:
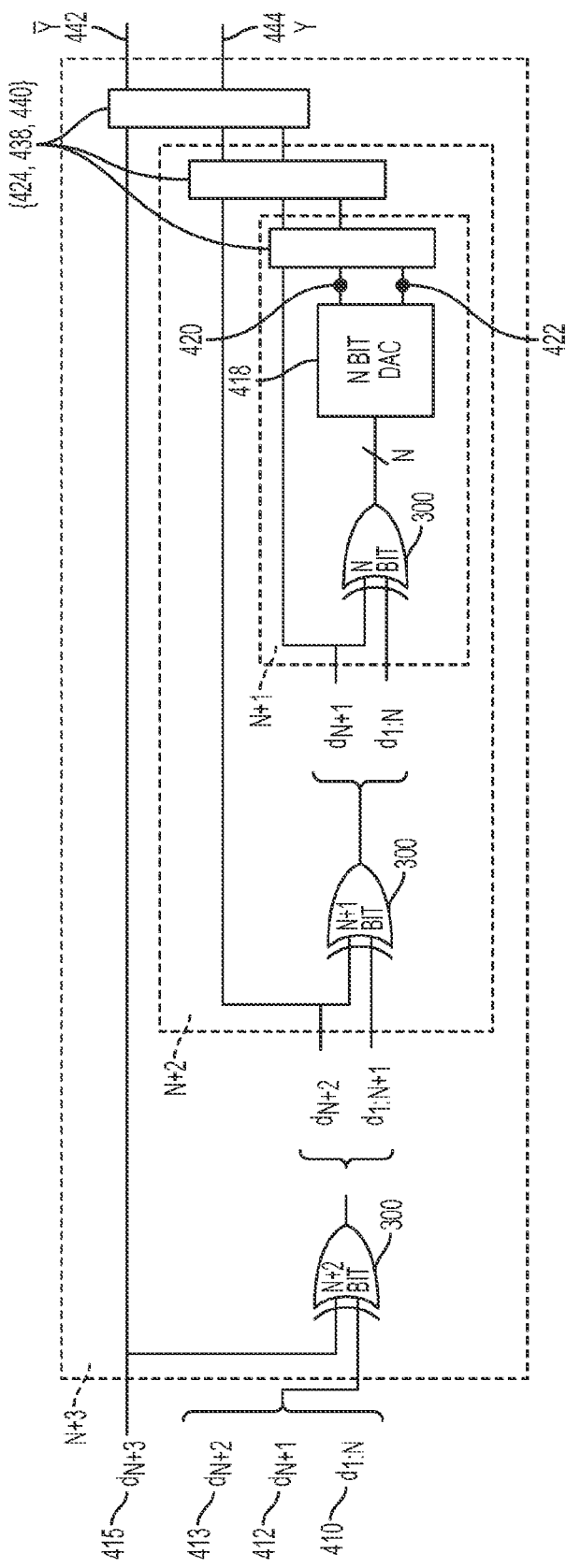
FIG. 9 shows cascaded N bit DACs connected to form an N+3 bit DAC.

In another embodiment, the approach above can be used to obtain an extended resolution monotonic DAC by cascading stages of the N Bit DAC 400 described above. As shown in FIG. 4, the DAC 418 is a differential DAC with its outputs offset by ½ LSB; the output is also in the same format, so that it may serve as the input to a subsequent stage in which the resolution is extended further. As shown in FIG. 9, such an extension may be implemented in a pipelined manner, with separate hardware at each stage. Alternatively, given discrete time circuitry, an extension may be implemented in a recursive fashion, where the output of a stage is held and used as the input to the same hardware for further extension of the resolution.

FIG. 9 shows a three bit extension to the N bit DAC 418 of FIG. 4. Each N bit exclusive OR 300 is as shown in FIG. 3 where the N+1 bit gates each of the N lower order bits. The weighting functions and switch 424, 438 and 440 are the same as in FIG. 4 but repeated three times. The N+3 bit DAC may itself be used as a building block for increased resolution DACs.

A single stage of the sort described above in FIG. 4 or 6 is very tolerant of errors that could result from mismatches, gain errors, offsets and the like. Pipelined or recursive implementations, such as in FIG. 9, are similarly robust with the exception of offsets introduced in producing the weighted sums. The process of increasing the resolution depends on having an offset of nominally ½ LSB in the lower resolution DAC that is to have its resolution extended. If the offset is not exactly ½ LSB the step size at the carry points will differ from an LSB as seen at the extended range output. In order to maintain monotonicity, that offset has to be within the range between 0 and 1 LSB. Since the LSB decreases through the length of a pipeline, or through the sequence of steps in a recursive implementation, eventually a point will be reached where even a very small offset in the summing circuitry will produce a nonmonotonic output. The number of stages that may be used in a pipeline or recursive implementation is set by the requirement that the offset, both intentional and accumulated from errors, at the input to the last stage is within the range of 0 to 1 LSB.

An advantage of the use of stages that increase resolution by more than one bit per stage is that the resolution obtainable while still maintaining monotonicity is increased if the last stage adds more bits. For a 16 bit DAC, the design estimates were that offsets could be controlled within allowable limits to the 11 or 12 bit level. A 16 bit DAC was chosen to have an initial 1 bit DAC, and a stage that adds 5 bits that is used recursively three times to reach 16 bits of resolution. The input to the last stage is thus at a resolution of 11 bits.

What is claimed is:

1. A N+M bit Digital to Analog Converter (DAC) comprising:
   an N bit Digital to Analog Converter (DAC) with a true output and a complementary output;
   wherein the true output and complementary output of the N bit digital to analog converter are offset by substantially a half least significant bit;
   a first weighting processor producing a true output of the N+M bit Digital to Analog Converter, wherein the true output is a weighted combination of the true and complementary outputs of the N bit Digital to Analog Converter;
   a second weighting processor producing a complementary output of the N+M bit Digital to Analog Converter, wherein the complementary output of the N+M bit Digital to Analog Converter is a weighted combination of the true and complementary outputs of the N bit Digital to Analog Converter;
   wherein the first and second weighting processors adjust at each major carry transition of M most significant input bits such that the true output and complementary output are monotonic;
   and wherein N and M are positive integers.

2. The N+M bit Digital to Analog converter of claim 1 wherein the adjustment at each major carry transition is to transfer a least significant bit weight within the first and second weighting processors.

3. The N+M bit Digital to Analog Converter of claim 1 wherein the adjustment in the first and second weighting processors occur on alternate major carry transitions.

4. The N+M bit Digital to Analog Converter of claim 1 further comprising a processor that maintains N least significant input bits to the input of the N bit Digital to Analog Converter across a major carry transition of the M most significant input bits.

5. The N+M bit Digital to Analog Converter of claim 4 wherein the processor is an N bit Exclusive OR gate ORing each bit of the N least significant input bits with a N+1 significant input bit.

6. The N+M bit Digital to Analog Converter of claim 1 further comprising a first switch and a second switch;
   wherein the first switch connects the true output of the N bit DAC to an input of the first weighting processor and an input of the second weighting processor as a function of the M most significant input bits and the second switch connects the complementary output of the N bit DAC to an input of the first weighting processor and an input of the second weighting processor as a function of the M most significant input bits.

7. The N+M bit Digital to Analog Converter of claim 6 wherein the first switch and the second switch alternatively change connections as a function of the M most significant input bits.

8. A N+1 bit Digital to Analog Converter (DAC) comprising:
- an N bit DAC wherein N is a positive integer and wherein the N bit DAC has a true output and a complementary output and wherein the outputs are offset by substantially a half least significant bit;
- an input processor accepting N+1 input bits and supplying N input bits to the N bit DAC such that the input processor maintains the input to the N bit DAC across a major carry transition of the N+1 input bit;
- a first processing unit producing a true output of the N+1 bit DAC, wherein the true output of the N+1 bit DAC is a weighted combination of the complementary output of the N bit DAC and the true output of the N bit DAC;
- wherein the weighting is such that the true output of the N+1 bit DAC is monotonic across the change of the N+1 input bit;
- a second processing unit producing a complementary output of the N+1 bit DAC, wherein the complementary output of the N+1 bit DAC is a weighted combination of the complementary output of the N bit DAC and the true output of the N bit DAC;
- wherein the weighting is such that the complementary output of the N+1 bit DAC is monotonic across the change of the N+1 input bit.

9. The N+1 bit Digital to Analog Converter of claim 8 wherein the input processor is an N bit Exclusive OR gate.

10. The N+1 bit Digital to Analog converter of claim 8 wherein the first and second processing units transfer a least significant bit weight at each major carry transition.

11. An N+2 bit digital to analog converter (DAC) comprising:
- N+2 input bits, a true analog output and a complementary analog output;
- an N bit digital to analog converter (DAC) wherein N is a positive integer, the N bit DAC has N input bits, a true output and a complementary output and wherein the outputs are offset by substantially a half least significant bit;
- a first switch wherein the complementary output of the N bit DAC is switched to either a first output, a second output or a third output of said first switch according to the state of the N+2 and N+1 input bits;
- a second switch wherein the true output of the N bit DAC is switched to either a first output or a second output of said second switch according to the state of the N+2 and the N+1 input bits;
- an exclusive OR gate accepting the N+1 input bits and supplying the N input bits of the N bit DAC wherein each of the N input bits is exclusively OR'd with the N+1 bit;
- a first processing unit with an output and first, second, third and fourth inputs wherein the output of the first processing unit is the complementary output of the N+2 bit DAC, the first input of the first processing unit is connected to the first output of the first switch, the second input of the first processing unit is connected to the first output of the second switch, the third input of the first processing unit is connected to the second output of the first switch and the fourth input of the first processing unit is connected to the second output of the second switch;
- a second processing unit with an output and first, second, third and fourth inputs;
- wherein the output of the second processing unit is the true output of the N+2 bit DAC, the first input of the second processing unit is connected to the first output of the second switch, the second input of the second processing unit is connected to the second output of the first switch, the third input of the second processing unit is connected to the second output of the second switch and the fourth input of the second processing unit is connected to the third output of the first switch;
- wherein the first processing unit output is the sum of first input of the first processing unit multiplied by a first scale factor, the second input of the first processing unit; multiplied by a second scale factor, the third input of the first processing unit multiplied by a third scale factor and the fourth input of the first processing unit multiplied by a fourth scale factor
- wherein the second processing unit output is the sum of the first input of the second processing unit multiplied by the fourth scale factor, the second input of the second processing unit multiplied by the third scale factor, the third input of the second processing unit multiplied by the second scale factor and the fourth input of the second processing unit multiplied by the first scale factor.

12. An N+M bit digital to analog converter (DAC) comprising one or more N+1 bit DACs of claim 8 in cascade.

13. An N+M bit digital to analog converter (DAC) comprising one or more N+2 bit DACs of claim 11 in cascade.

14. An N+M bit digital to analog converter (DAC) comprising one or more N+1 bit DACs of claim 8 and at least one N+2 bit DAC of claim 11 in cascade.

* * * * *